(12) United States Patent
Caplet (10) Patent No.: US 9,005,353 B2
(45) Date of Patent: Apr. 14, 2015

(54) GETTER STRUCTURE INCLUDING A GAS-PERMEABLE MATERIAL DESCRIPTION

(75) Inventor: Stéphane Caplet, Sassenage (FR)

(73) Assignee: Commissariat à l'énergie atomique et aux énergies alternatives, Paris (FR)

( * ) Notice: Subject to any disclaimer, the term of this patent is extended or adjusted under 35 U.S.C. 154(b) by 329 days.

(21) Appl. No.: 13/530,596

(22) Filed: Jun. 22, 2012

(65) Prior Publication Data

US 2012/0325091 A1     Dec. 27, 2012

(30) Foreign Application Priority Data

Jun. 23, 2011   (FR) ...................................... 11 55565

(51) Int. Cl.
*B01D 53/02* (2006.01)
*B81B 7/00* (2006.01)

(52) U.S. Cl.
CPC .................................... B81B 7/0038 (2013.01)

(58) Field of Classification Search
None
See application file for complete search history.

(56) References Cited

U.S. PATENT DOCUMENTS

| | | | | |
|---|---|---|---|---|
| 5,876,487 | A * | 3/1999 | Dahlgren et al. .................. 96/13 |
| 6,077,335 | A * | 6/2000 | Schneider et al. .............. 96/135 |
| 6,806,557 | B2 * | 10/2004 | Ding .............................. 257/659 |
| 6,923,625 | B2 | 8/2005 | Sparks |
| 7,204,737 | B2 * | 4/2007 | Ding et al. ...................... 445/24 |
| 7,378,294 | B2 * | 5/2008 | Ding et al. ...................... 438/51 |
| 7,789,949 | B2 * | 9/2010 | Sparks et al. ................... 96/132 |
| 2009/0081434 | A1 | 3/2009 | Sturland et al. |
| 2011/0277638 | A1 * | 11/2011 | Li et al. .......................... 96/139 |

FOREIGN PATENT DOCUMENTS

| | | | |
|---|---|---|---|
| WO | WO 2008/071906 A1 | 6/2008 |
| WO | WO 2009/041950 A1 | 4/2009 |

OTHER PUBLICATIONS

U.S. Appl. No. 13/530,513, filed Jun. 22, 2012, Caplet, et al.
U.S. Appl. No. 13/544,032, filed Jul. 9, 2012, Ferrandon, et al.
French Preliminary Search Report Issued Feb. 1, 2012 in Patent Application No. 1155565 (with English translation of Categories of Cited Documents).
European Enlarged Search Report Issued Aug. 31, 2012 in Patent Application No. 12 17 2712.7 (with English translation of Categories of Cited Documents).

(Continued)

*Primary Examiner* — Duane Smith
*Assistant Examiner* — Phillip Shao
(74) *Attorney, Agent, or Firm* — Oblon, McClelland, Maier & Neustadt, L.L.P.

(57) ABSTRACT

A getter structure including at least one portion of getter material at least one face of which is positioned against at least one portion of gas-permeable material such that said portion of getter material is able to achieve a gaseous absorption and/or adsorption at least by said face through at least said portion of gas-permeable material, and in which the portion of gas-permeable material includes one or more channels made at the level of a face of said portion of gas-permeable material which is in contact with the portion of getter material, where the portion of getter material is able to achieve a gaseous absorption, or a gaseous adsorption, or both a gaseous absorption and a gaseous adsorption, via the channel or channels.

19 Claims, 5 Drawing Sheets

(56) References Cited

OTHER PUBLICATIONS

Stéphane Caplet et al., "Vacuum wafer-level packaging for MEMS applications", Proceedings of SPIE, XP-002360340, vol. 4979, Jan. 27, 2003, pp. 271-278.

K.M.A. Sobahan et al., "Nanostructured porous $SiO_2$ films for antireflection coatings", Optics Communications, vol. 284, Issue 3, Feb. 2011, pp. 873-876.

B.A. Movchan et al., "Some approaches to producing microporous materials and coatings by EB", Surface and Coatings Technology, vol. 165, Issue 1, Feb. 3, 2003, pp. 90-100.

B.A. Movchan, "Hybrid Electron Beam Nanotechnology of Inorganic Material Deposition in Vacuum", http://www.paton-icebt.kiev.ua/publication/movchan_nano.pdf, 2008, 21 pages.

* cited by examiner

GETTER STRUCTURE INCLUDING A GAS-PERMEABLE MATERIAL

DESCRIPTION

TECHNICAL FIELD

The invention concerns the field of getter structures, i.e. structures including one or more getter materials to achieve gaseous absorption and/or adsorption. Such a structure can, notably, be used in the field of microcomponents such as electromechanical microsystems (MEMS) or electromechanical nanosystems (NEMS), for example accelerometers, gyroscopes, or any other device, for example intended to be encapsulated in a high vacuum environment, under controlled pressure, or again in a protective atmosphere.

STATE OF THE PRIOR ART

A getter material is a material including, intrinsically and/or due to its microscopic morphology, gaseous absorption and/or adsorption properties. Such a getter material can thus form a chemical gas pump when it is placed in an enclosed environment. This type of material can also be used in many microelectronic applications such as vacuum tubes, field-effect systems or again with microcomponents such as MEMS or NEMS in order to achieve, for example, a high vacuum environment or controlled pressure environment. In the case of encapsulated MEMS or NEMS, a high vacuum environment formed around the device for example enables improved operation of the resonant mechanical systems to be obtained, but also optical systems which are sensitive to absorption of light radiation by surrounding gases of the device.

Non-evaporable getter materials (called NEG materials) are, for example, metals such as titanium, zirconium, hafnium or again the binary metal alloys of these three materials. Such a non-evaporable material is generally directly deposited on a wall of the enclosure in which it is sought to produce a chemical pump in the form of a thin layer. This material is then activated thermally by heating it through the wall of the enclosure on which it is deposited. Document U.S. Pat. No. 6,923,625 B2 describes the production of such a thin getter material layer.

The pumping capacity of such a thin getter material layer is determined by the area of the material in contact with the gas to be absorbed. The larger this area the greater the absorption capacity of the getter material. In document U.S. Pat. No. 6,923,625 B2 it is notably described that the thin layer of getter material can be deposited on a surface having projections. Thus, the surface of the getter material deposited on the side walls of the projections enables the total absorbent and/or adsorbent area of the getter material in the cavity to be increased.

However, this increased area of the getter implies that the area on which the getter material is deposited is structured, which complicates the production of the device including such a getter structure. In addition, it is sometimes not possible to structure the surface intended to receive the getter material.

ACCOUNT OF THE INVENTION

Thus there is a need to provide a getter structure which increases, for a given portion or layer of getter material, the gaseous absorption and/or adsorption area of the getter material, without having to produce a relief structuring, for example with projections, of the surface intended to receive the getter material.

To accomplish this, one embodiment proposes a getter structure including at least one portion of getter material, at least one face of which is positioned against at least one portion of gas-permeable material such that said portion of getter material is able to achieve a gaseous absorption and/or adsorption at least by said face through at least said portion of gas-permeable material.

Another embodiment proposes a getter structure including at least one portion of getter material, at least one face of which being positioned against at least one portion of gas-permeable material such that said portion of getter material is able to achieve a gaseous absorption and/or adsorption at least by said face through at least said portion of gas-permeable material, and in which the portion of gas-permeable material includes one or more channels made at the level of, or in, a face of the portion of gas-permeable material which is in contact with the portion of getter material, where the portion of getter material is able to achieve a gaseous absorption and/or adsorption via the channel or channels.

This getter structure makes accessible the "hidden" face, for example the rear face, of the portion of getter material, namely the face of the portion of getter material intended to be located on the side of the support on which the portion of getter material rests or is suspended. Compared to a getter structure of the prior art, in which almost the entire gaseous absorption and/or adsorption surface is formed by the front face of the portion of getter material, this surface is almost doubled by making the rear face of the portion of getter material accessible to the gases.

The term "permeability" of a portion of material is understood to mean its ability to allow gas to flow in said portion of material, for example both in at least one direction parallel to a principal plane of the portion, and in a direction perpendicular to this plane. Gases can therefore flow through the portion of gas-permeable material, for example both laterally and vertically.

Such a getter structure may be positioned in a cavity in which one or more microcomponents are encapsulated. Thus, the front and rear faces of the portion of getter material, or all the faces of the portion of getter material, can be used for absorption and/or adsorption of the gases present in the cavity. Such a getter structure may also be positioned outside the cavity, for example on a cover closing the cavity, where the portion of gas-permeable material covers an opening formed through the cover, and such that the getter material is able to communicate with the interior of the cavity through this opening and the portion of gas-permeable material.

The term "portion" may designate one or more parts of a layer or of several layers for example one or more remaining parts of one or more etched layers, but also one or more non-etched layers, i.e. one or more complete layers.

The portion of gas-permeable material may include one or more channels made in a face of said portion of gas-permeable material which is in contact with the portion of getter material, where the portion of getter material is able to achieve a gaseous absorption and/or adsorption via the channel or channels. Such a portion of gas-permeable material may be produced from any type of material in which it is possible to form this or these channels, for example by etching. The channel or channels of the portion of gas-permeable material contribute in whole or in part to the permeability of said permeable portion. Whether or not the portion of gas-permeable material comprises a porous material, the channel or channels produced allow excellent gas flow within the portion of gas-permeable material.

A part of said face of the portion of gas-permeable material may not be covered by the portion of getter material. It is thus possible to access the portion of getter material from the face of the portion of gas-permeable material on which the portion of getter material is located, via the gas-permeable material. In addition, when the portion of gas-permeable material includes one or more channels, the channel or channels may emerge at the level of this part of the uncovered portion of gas-permeable material. When the getter material has local permeability, either by one or more etched channels, or by a porosity intrinsic to the material used, said part of permeable material may be completely covered by the portion of getter material, and the gases then traverse the getter material through this local permeability and are then diffused in the interface due to the permeable material.

The portion of gas-permeable material may comprise at least one porous material. In this case the dimensions of the pores, or porosities, of this porous material influence the speed of accessibility of the gases to the getter material. These pores are, for example, open and of dimensions (dimension of a side or of a diameter, depending on the shape of the pores) between approximately several nanometers and several hundred nanometers, for example between approximately 2 nm and 900 nm.

A part of the portion of gas-permeable material may not be covered by the portion of getter material.

The portion of gas-permeable material may be positioned between the portion of getter material and a support.

The portion of gas-permeable material may also have gaseous adsorption and/or absorption properties. The portion of permeable material may comprise getter material. It is thus possible to obtain a getter material including at least two different getter materials which may have different absorption and/or adsorption properties.

The portion of gas-permeable material may surround all or part of the portion of getter material. The portion of getter material can thus achieve a gaseous absorption and/or adsorption from all its faces which are in contact with the gas-permeable material.

The getter structure may also include at least one protective layer hermetic to the gases covering a stack including at least the portion of gas-permeable material and the portion of getter material. It is thus possible to protect the getter material while the getter structure or the device in which the getter structure is used is subjected to steps which might damage the getter material. In addition, it is possible temporarily to prevent the getter material, which may be thermally active, from achieving a gaseous absorption and/or adsorption. The getter material may be made accessible after an opening is made in the protective layer. It is thus possible to activate the gaseous absorption and/or adsorption function of the getter material at the desired time, by means of controlled opening of the protective layer.

The getter structure may also include at least one opening formed through the protective layer hermetic to the gases, and emerging onto the stack. The opening may emerge onto the portion of gas-permeable material, and/or onto the portion of getter material when the getter material has a local permeability.

The getter structure may include a stack of several portions of getter material and of several portions of gas-permeable material, where at least one face of each of the portions of getter material may be positioned against at least one of the portions of gas-permeable material, such that each of the portions of getter material is able to achieve a gaseous absorption and/or adsorption (that is a gaseous absorption, or a gaseous adsorption, or both a gaseous absorption and a gaseous adsorption) by said face, through at least said one of the portions of gas-permeable material.

The protective layer which is hermetic to the gases may cover the stack of portions of getter material and of portions of gas-permeable material. At least one opening may be formed through the protective layer which is hermetic to the gases, and may emerge onto the stack. The opening may emerge onto at least one of the portions of gas-permeable material, and/or onto at least one of the portions of getter material when the getter material has a local permeability.

Another embodiment also proposes a device including at least one microcomponent encapsulated in a cavity, and at least one getter structure as previously described, able to achieve an absorption and/or adsorption of the gas present in the cavity.

Another embodiment also concerns a device including at least one microcomponent encapsulated in a cavity, and in which at least one getter structure as previously described is positioned in the cavity.

The cavity may be formed between a substrate and a cover.

The getter structure may be attached to the substrate or to the cover. The getter structure and the substrate may be interdependent, or the getter structure and the cover may be interdependent It is also proposed a device including at least one microcomponent encapsulated in a cavity, where at least one opening is formed through at least one wall of the cavity, and covered by a part of a portion of gas-permeable material of a getter structure as previously described. The cavity may be formed between a substrate and a cover. The substrate and the cover may not be homogeneous. In particular, they may be formed by a substrate with sidewalls, where the cover and the substrate provide support for one another in the area of these walls.

A method for producing a getter structure is also proposed including at least the following steps:
  production of at least one portion of gas-permeable material;
  production of at least one portion of getter material at least one face of which is positioned against the portion of gas-permeable material such that said portion of getter material is able to achieve a gaseous absorption and/or adsorption by said face through at least said portion of gas-permeable material.

Another embodiment also proposes a method for producing a getter structure including at least the following steps:
  production of at least one portion of gas-permeable material;
  production of one or more channels at the level of, or in, a face of said portion of gas-permeable material which is intended to be in contact with at least one portion of getter material;
  production of the portion of getter material at least one face of which is positioned against the portion of gas-permeable material such that said portion of getter material is able to achieve a gaseous absorption and/or adsorption (that is a gaseous absorption, or a gaseous adsorption, or both a gaseous absorption and a gaseous adsorption) by said face through at least said portion of gas-permeable material via the channel or channels.

The method may also include a step of production of a protective layer hermetic to the gases covering a stack including at least the portion of gas-permeable material and the portion of getter material.

The portion of gas-permeable material and/or the portion of getter material and/or the hermetic protective layer may be produced by depositions through one or more stencils, or screens.

The depositions may be implemented in the same atmosphere, or in the same vacuum cycle. "Same vacuum cycle" is understood to mean that the structure is not exposed again to open air. It is possible, in the same vacuum cycle, to return the structure to a neutral atmosphere, notably to transfer from one item of equipment to another, for example from one deposition chamber to another, in order to prevent the deposited getter material from becoming saturated.

BRIEF DESCRIPTION OF THE ILLUSTRATIONS

The present invention will be better understood on reading the description of example embodiments given purely as an indication and in no way restrictively, making reference to the appended illustrations in which:

FIGS. 1 to 4B, 6 and 10A to 10C represent getter structures according to different embodiments;

Identical, similar or equivalent portions of the various figures described below have the same numerical references, to make it easier to move from one figure to another.

The various parts represented in the figures are not necessarily represented at a uniform scale, in order to make the figures more readable.

The various possibilities (variants and embodiments) must be understood as not being mutually exclusive, and being able to be combined with one another.

DETAILED ACCOUNT OF PARTICULAR EMBODIMENTS

Figure 1:
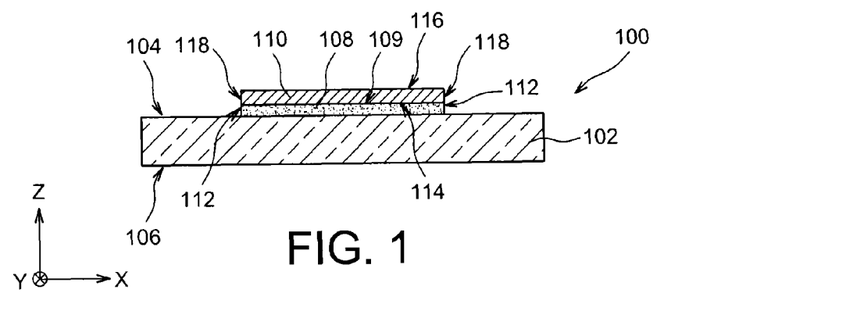

Reference is firstly made to FIG. 1, which represents a getter structure 100 according to a first embodiment.

Getter structure 100 includes a support 102, for example a semiconductor layer, including two main faces 104 and 106. The structure 100 also includes a portion 108 of gas-permeable material, formed on one of the main faces 104 of the support 102. This gas-permeability of the material of the portion 108 is obtained in this case due to the fact that the material of the portion 108, for example SiOC deposited by cathodic sputtering on the support 102, is porous in nature. As a variant, such a portion of porous material 108 may be formed by vapor deposition of $SiO_2$, as described in document "Nanostructured porous $SiO_2$ films for antireflection coatings" by K. M. A Sobahan et al., Optics Communication, Volume 284, Issue 3, February 2011, pages 873-876, or by a metal deposition of the $ZrO_2$ type by vapor deposition, as described in document "Some approaches to producing microporous materials and coatings by EB PVD" by B. A. Movchan et al., Surface and Coatings Technology, Volume 165, Issue 1, 3 Feb. 2003, pages 90-100.

The open porosities of the porous material enable the gases to flow through the portion of gas-permeable material. The porosities may be both lateral (porosities having openings in its side faces) and vertical (having openings in its front and rear faces), where these different porosities communicate with one another within the portion 108.

In the example described here, the portion of porous material 108 is, for example, obtained by firstly producing a deposit by cathodic sputtering of SiOC on the face 104 of the support 102, followed by structuring, for example an etching, of this layer in order to retain only the portion 108, the dimensions of which are equal to the desired dimensions. As a variant, the portion of porous material 108 may be produced in a single step by depositing the porous material on the face 104 of the support 102 through a stencil, thus forming the portion of porous material 108 directly on the face 104 of the support 102.

The getter structure 100 also includes a portion of getter material 110 positioned on a face 109 of the portion of porous material 108. As with the portion of porous material 108, the getter material may be firstly deposited in the form of a layer, for example by evaporation or by spraying, on the portion of porous material 108 and on the support 102, and then structured (for example by etching) in order to form the portion 110, the dimensions of which are, for example, similar to those of the portion of porous material 108, or indeed be produced directly by a deposition of the getter material through a stencil. In this first embodiment, the portion of porous material 108 is completely covered by the portion of getter material 110.

In an advantageous embodiment, the portions of porous material 108 and getter material 110 may both be produced by two successive depositions through the same stencil, possibly in the course of the same vacuum cycle, i.e. without exposure between these two depositions.

The material of the portion 108 includes open porosities, or pores, such that gas is able to flow through them. The portion of porous material 108 is therefore gas-permeable and has, within it, porosities which are both horizontal (porosities having openings in its side faces 112) and vertical (having openings in its face 109 in contact with the getter material and in its face in contact with the support 102), where these different porosities are connected to one another within the portion 108. Gas is thus able to flow through the porosities of the portion 108 by entering by the side faces 112 of the portion 108, and can reach a rear face 114 of the portion of getter material 110.

The portion of getter material 110 can therefore achieve a gaseous absorption and/or adsorption by its front face 116, by its side faces 118, but also by its rear face 114 through the portion of porous material 108. In this first embodiment, the portion of getter material 110 can therefore achieve a gaseous absorption and/or adsorption from all its external surfaces (front face 116, rear face 114 and side faces 118).

The portion of porous material 108 is, for example, between approximately 100 nm and 10 μm thick.

The getter material of the portion 110 is a non-evaporable getter material, for example titanium and/or zirconium and/or chromium and/or vanadium and/or niobium and/or tantalum and/or any other alloy or material having gaseous absorption and/or adsorption properties. The portion of porous material 110 is, for example, between approximately 100 nm and 10 μm thick.

The portion of getter material 110 may be produced in the form of a thin layer.

In a variant of the structure 100, the portion of porous material 108 and/or the portion of getter material 110 could be produced in the form of non-structured layers, i.e. layers covering all or a large part of the face 104 of the support 102.

Figure 2:
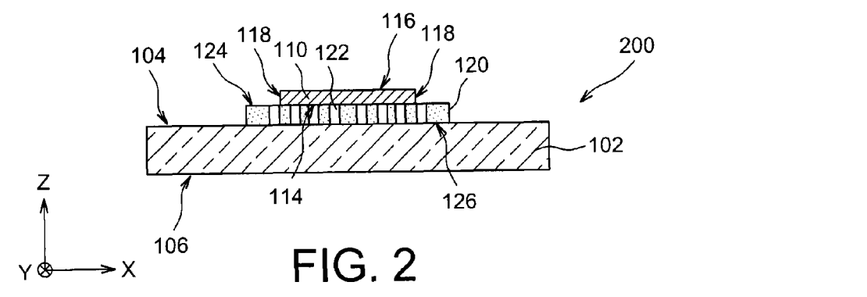

FIG. 2 represents a getter structure 200 according to a second embodiment.

Like the previously described getter structure 100, the getter structure 200 includes the support 102, together with the portion of getter material 110 which is positioned on the face 104 of the support 102 through a portion 120 of gas-permeable material. However, unlike the portion of porous material 108 of the getter structure 100, the gas permeability of the portion 120 is not obtained through the intrinsic porosity of the material used (portion 120 is, for example, SiO$_2$-based), but is obtained due to a structuring of a dense network of channels 122 produced in the portion of material 120. These channels 122, which are for example obtained through the implementation of photolithography and etching steps, in this case traverse the portion 120 all the way through (where this thickness is, for example, between approximately 1 μm and 10 μm), from a front face 124 to a rear face 126 of the portion 120.

Figure 3:
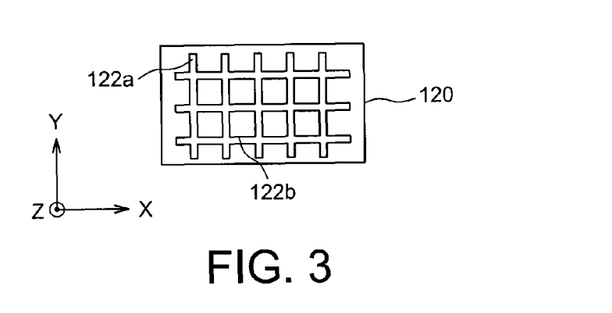

FIG. 3 represents a schematic top view of the portion of material 120 and a part of channels 122. It can be seen in this figure that the permeability function is obtained due to channels 122 arranged in the form of a grid comprising vertical channels 122a (roughly parallel to the Y axis) and horizontal channels 122b (roughly parallel to the X axis), which are perpendicular relative to one another. It can be seen in FIG. 2 that the dimensions in plane (X,Y) of the portion of material 120 are greater than those of the portion of getter material 110, in order that at least parts of the channels 122, in this case the ends, are not covered by the layer of getter material 110. A gas can thus enter, from the front face 124 of the portion 120, through the ends of channels 122 which are not covered by the portion of getter material 110, and then reach the rear face 114 of the portion of getter material 110 by flowing through the channels 122 of the portion of material 120. The width of the channels (dimension in the X axis in the case of the vertical channels 122a, and dimension in the Y axis in the case of the horizontal channels 122b) is, for example, between approximately 100 nm and 1 μm. The channels 122 may be produced part way through the thickness of the portion of material 120, for example up to a depth of between approximately 2 and 3 μm. The channels 122 are preferably produced such that they have an aspect ratio (height/width) greater than or equal to 2. In the example of FIG. 3, the channels 122 do not emerge at the level of the side faces of the portion of material 120. However, in a variant, it can be that the channels 122 are laterally emerging, and the channels are in this case accessible from the side faces of the portion of material 120.

The pattern formed by the channels 122 may be different from the one represented in FIG. 3, and it can be that they do not form a grid. Thus, the channels 122 can form, for example, a star, or any other pattern in which, when the portion of material 120 is covered by the portion of getter material 110, at least a part, for example the ends, of the pattern formed by these channels 122 is not covered by the portion of getter material 110. In another variant, it can be that the channels 122 emerge at the level of one or more of the side faces of the portion 120 (faces perpendicular to the faces in contact with the support 102 and with the portion of getter material 110). In this case, the portion of material 120 may have dimensions similar to those of the portion of getter material 110 and have its front face 124 completely covered by the portion of getter material 110.

In a variant embodiment of the previously described getter structures 100 and 200, it can be that the portion of porous material 108, or the portion of material 120 including the channels 122, is not produced directly on the support 102, but that one or more portions (or layers) of material or materials is/are positioned between the portion of gas-permeable material 108 or 120 and the support 102. It can also be that an opening is made through the support 102 in order to provide access to the portion of gas-permeable material 108 or 120, and thus also provide access to the portion of getter material 110.

In addition, in another variant embodiment, it can be that the previously described getter structures 100 and/or 200 are produced such that the permeability of the portions of material 108 and/or 120 is produced by channels formed in said portions, and possibly by porosities intrinsic to the material or materials used to produce the portions 108 and/or 120.

Figure 4A:
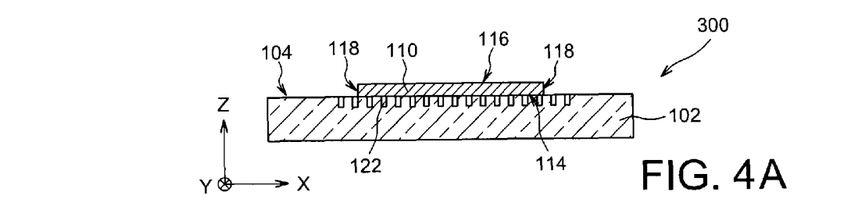

FIG. 4A represents a getter structure 300 according to a third embodiment.

Getter structure 300 includes the portion of getter material 110 which in this case is positioned directly on the front face 104 of the support 102, i.e. against this face 104. In this case, the channels 122 are produced in the support 102, at the level of its front face 104. In this third embodiment, the channels 122 are produced only part way through the support 102.

The part of the support 102 including the channels 122 therefore forms a portion of gas-permeable material.

The gas-permeability function achieved by the channels 122 of this getter structure 300 is similar to the one produced by the channels 122 of the previously described getter structure 200. A part of channels 122 is not covered by the portion of getter material 110. The pattern (for example a grid) and/or the dimensions of the channels 122 of the getter structure 200 may be similar to the pattern and/or dimensions of the channels 122 of the getter structure 300.

Thus, when the substrate 102 can be etched, the advantage of such getter structure 300 is that it does not produce a portion of additional material between the substrate and the getter material, due to the fact that the channels are produced directly in the substrate.

The previously described getter structures 200 and 300 therefore enable the getter material 110 to achieve a gaseous absorption and/or adsorption by its rear face 114, without having to bring this rear face 114 into contact with a material intrinsically including porosities. However, it can be that the support 102 of the getter structure 300, or the portion of material 120 of the getter structure 200, is made from a porous material, for example of a nature similar to the porous material of the portion 108 of the getter structure 100.

Figure 4B:
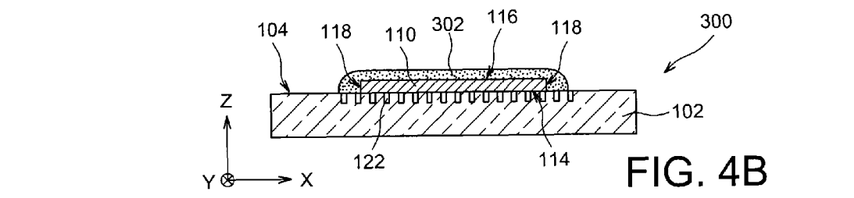

FIG. 4B represents a variant embodiment of the getter structure 300. In addition to the previously described elements in connection with FIG. 4A, the getter structure 300 represented in FIG. 4B includes a protective layer 302 comprising at least one fusible material (for example a metal) covering the portion of getter material 110, and also the parts of the channels 122 which are not covered by the portion of getter material 110.

As long as the portion of getter material 110 is covered by the protective layer 302 this getter material is thus protected from the external environment. Conversely, when the getter structure 300 is exposed to a temperature higher than the melting point of the material of the protective layer 302, the molten material is then positioned above the portion of getter material 110 due to the high wettability of the fusible material with regard to the getter material (which are, for example, both metal materials), thus releasing the parts of the channels 122 (for example the ends) which are not covered by the portion of getter material 110.

Protective layer 302 is advantageously deposited during the same vacuum cycle as the portion of getter material 110, for example by evaporation, thus preventing any exposure of the getter material to open air. The protective layer 302 comprises, for example, of indium, and/or an alloy of the gold-tin type (29% at.), or again any metal or alloy the melting point of which is higher than the temperatures used during assembly of the getter structure 300 with a structure to form a cavity in which the getter structure 300 is encapsulated. It is thus possible to produce an "opening" of channels 122 (due to the shrinkage of the material of protective layer 302 above the channels), and an activation of the getter material after such an assembly.

It is sometimes necessary or advantageous to protect the getter material by encapsulating it by a protective layer which is hermetic to the gases, in order not to expose the getter material temporarily to the surrounding gases. Such protection can notably be achieved when the getter structure is positioned within a cavity in which one or more microcomponents are encapsulated.

Figure 5A:
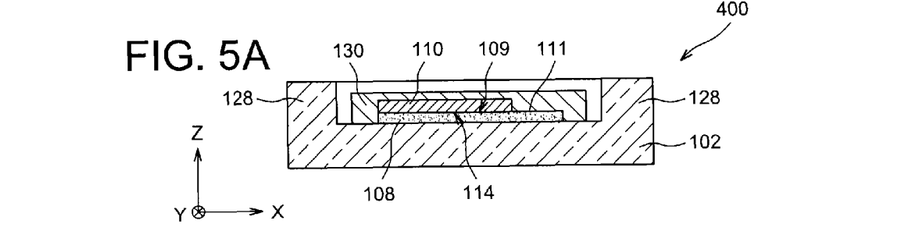
FIGS. 5A to 5C, 7, 8, 9A and 9B represent the steps of a method of production of a device including a getter structure according to several variants.

FIG. 5A represents a getter structure 400 according to a fourth embodiment including, as the previously described getter structure 100, the support 102 on which the portion of porous material 108 and the portion of getter material 110 are positioned. In this fourth embodiment, the support 102 is intended to form the cover of a cavity into which a microcomponent of a device 1000 is intended to be encapsulated. The support 102 includes side portions 128 intended to form side walls of the cavity. The dimensions (in the (X,Y) plane) of the portion of porous material 108 are in this case greater than those of the portion of getter material 110, in order that a part 111 of the portion of porous material 108 is not covered by the portion of getter material 110.

The getter structure 400 also includes a hermetic protective layer 130, which is for example gold- and/or aluminum-based, and the thickness of which is for example between approximately 1 µm and 10 µm, encapsulating the portion of getter material 110 and the portion of porous material 108, and by this means protecting these portions during implementation of steps which may, for example, damage the getter material and/or impair the gaseous absorption and/or adsorption properties of the getter material, for example in the case of chemical cleaning by means of an HF solution. This protective layer 130 also enables the getter material 110 to be temporarily prevented from gas pumping (due to the fact that the getter material 110 is intended to produce this pumping only after it has been positioned in the cavity which will be closed hermetically).

The getter structure 400 may be obtained firstly by forming the portion of porous material 108, and then the portion of getter material 110, and subsequently the hermetic protective layer 130. In an advantageous embodiment, the getter structure 400 will be obtained by producing the portion of porous material 108, the portion of getter material 110 and the hermetic protective layer 130 in three successive steps of deposition accomplished in a single vacuum cycle through three stencils, in this case having different patterns.

Figure 5B:
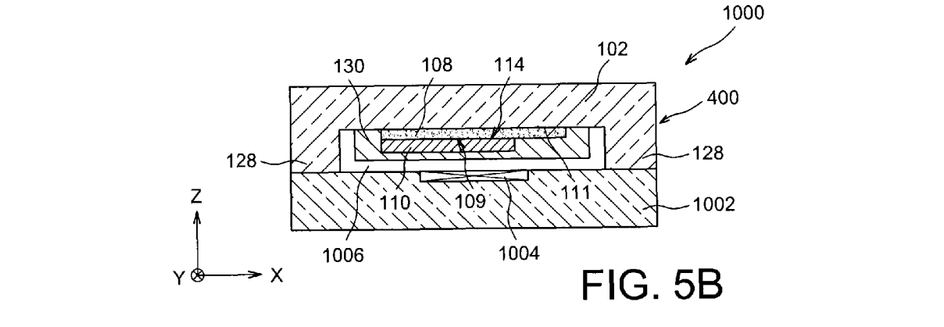

The getter structure 400 is then assembled on a substrate 1002 on which a microcomponent 1004 is produced, for example of the MEMS and/or NEMS type, thus forming device 1000 (FIG. 5B). The microcomponent 1004 is therefore encapsulated in a cavity 1006 formed between the support 102 (forming the cover) and the substrate 1002. The side walls of the cavity 1006 correspond to the side portions 128 of the support 102. The side portions 128 are assembled to the substrate 1002 by a bonding hermetically closing the cavity 1006, accomplished for example by molecular bonding or any other appropriate bonding technique, such as anode or eutectic bonding.

If the portion of getter material 110 and the hermetic protective layer 130 have not been produced in the same vacuum cycle, the getter material may be thermally activated whilst being hermetically encapsulated. This thermal activation enables the potential pumping capacity of the getter material to be regenerated. The getter's potential pumping capacity is preferably regenerated before an opening of the hermetic protective layer is made. By this means a hermetically encapsulated getter material with its full active potential is obtained.

This protective encapsulation firstly enables this potential pumping capacity to be kept active until the getter is positioned in the product and a channel providing access to the getter material is opened in the protection. Secondly, encapsulation can also play a protective role against potential aggressions of the process which must be accomplished before the end product is produced: for example during chemical cleaning incompatible with the getter material (for example with an HF solution), or during a thermal treatment in a pumpable atmosphere by the getter, for example at a temperature of approximately 400° C. in an $N_2$ atmosphere.

Since the getter material is hermetically encapsulated the cover may be degassed at temperatures at which a non-hermetically protected getter would be activated, and which would cause gas pumping (within the degassing chamber, or when once again exposed to air). Due to the fact that the getter material is hermetically encapsulated, degassing of the cover and exposure to air do not impair the getter's potential pumping capacity.

The different technological steps then accomplished on the device 1000 therefore have no impact on the getter material 110 provided the latter is protected by the hermetic protective layer 130.

In addition, the pumping capacities of the getter material 110 are preserved for as long as the latter is hermetically confined between the protective layer 130 and the support 102.

Figure 5C:
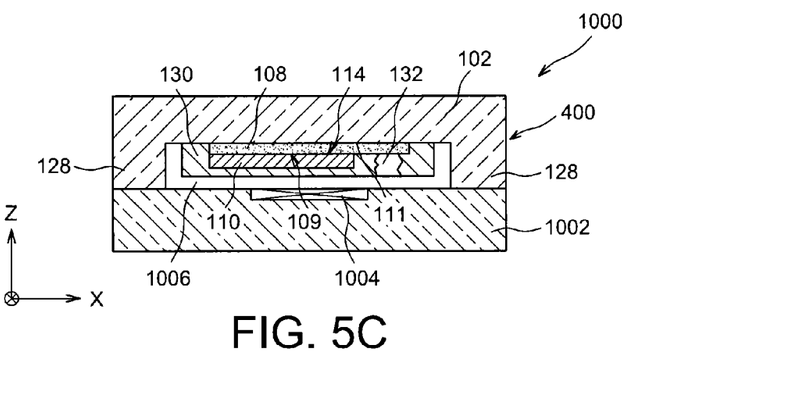

When it is desired to "activate" the gaseous absorption/adsorption function of the getter material, an opening 132 is made, for example located in a part of the protective layer 130, through the hermetic protective layer 130, in order to form a means of access to the part 111 of the portion 108 of porous material (FIG. 5C). This opening 132 is, for example, made by laser impact through the substrate 1002.

If this laser impact causes scoria (solid waste), this opening 132 may be made in a portion of the protective layer 130 at some distance from the microcomponent 1004, in order to reduce or eliminate pollution of these scoria which can impair operation of the microcomponent 1004.

Due to this opening 132, the getter material 110 can implement its gaseous absorption and/or adsorption function from its rear face 114 through the portion 108 of porous material and the opening 132. By this means it is possible, for example, to produce a low-pressure environment in the cavity 1006 around the microcomponent 1004.

In a variant embodiment of the getter structure 400, the portion of porous material 108 may be replaced by the portion of material 120 including the channels 122 of the getter structure 200. In this case, the opening 132 produced through the protective layer 130 will form a means of access to at least a part of the channels 122. In another variant embodiment, it can be that the portion of getter material 110 is formed directly on the support 102, above the channels 122 produced directly in the support 102. In this case also, the opening 132 produced through the protective layer 130 will form a means of access to at least a part of these channels 122. In addition, as with the previously described getter structures 100, 200, one or more portions or layers of material may be positioned between the support 102 and the portion of porous material 108, or between the support 102 and the portion of material 120 including the channels 122.

In another variant embodiment, the protective layer 130 may be replaced by the layer 302 comprising fusible material.

In another variant it can be that a part of the protective layer 130, at an end of one or more channels 122, is covered by a portion of fusible material. When the protective layer 130 is quite fine and comprises a material which can be dissolved by the fusible material when molten (in the case, for example, of a protective layer 130 comprising chromium, of thickness of between few nanometers and few tens of nanometers), melting of the fusible material therefore locally dissolves the protective layer 130, forming by this means one or more means of access to the parts of one or more channels 122 located directly below the opening formed through the protective layer 130.

In another variant embodiment a layer of fusible material may be produced on the periphery of the portion of getter material 110, and may be able to cover a part of the getter portion 110 (the protective layer 130 is absent). By exposing the fusible material to a sufficiently high temperature, the fusible material is collected in the form of a metal droplet at the edge of the portion of getter material, producing by this means a means of access to the end of channels 122. The getter material therefore remains activatable in both its main faces.

Figure 6:
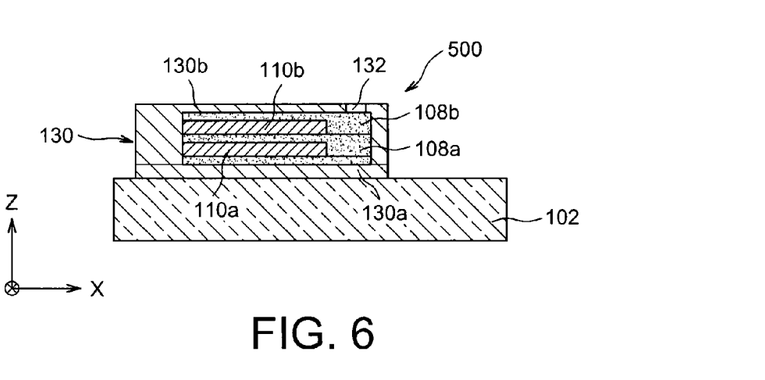

Reference is made to FIG. 6, which represents a getter structure 500 according to a fifth embodiment.

In this case, the getter structure 500 includes a stack of several portions of getter material (two in the example of FIGS. 6) 110a and 110b positioned on the support 102. The portions of getter material 110a, 110b are in this case completely surrounded by the portions of porous material 108a, 108b. This entire stack is protected by the hermetic protective layer 130, which completely surrounds the portions of porous material 108a, 108b. In this fifth embodiment, all the faces of the portions of getter material 110a, 110b are in contact with the porous material of portions 108a, 108b. Thus, through the opening 132 produced through the protective layer 130, and which emerges onto the portion of porous material 108b, the portions of getter material 110a, 110b can produce a gaseous absorption and/or adsorption from all their faces (front, rear and side faces), through the portions of porous material 108a, 108b.

The getter structure 500 may be obtained by firstly producing a first part 130a of the hermetic protective layer 130, for example by deposition, where this part forms a flat layer portion positioned against the support 102. A first part (also in the form of a flat portion) of the first portion of porous material 108a is then formed on the first part 130a of the hermetic protective layer 130. The first portion of getter material 110a is then deposited on the first part of the first portion of porous material 108a. A second part of the first portion of porous material 108a is then deposited on the first portion of getter material 110a such that the first portion of getter material 110a is completely surrounded by the first portion of porous material 108a. The second portion of getter material 110b is then deposited on the first portion of porous material 108a using, for example, the same stencil as the one used for the deposition of the first portion of getter material 110a. The second portion of porous material 108b is then deposited by completely covering the second portion of getter material 110b. Lastly, a second part 130b of the hermetic protective layer 130 is deposited, such that this hermetic protective layer 130 surrounds and hermetically protects the portions of getter material 110a, 110b and the portions of porous material 108a, 108b. Lastly, the opening 132 is produced through the hermetic protective layer 130. All these steps will advantageously be accomplished in the same vacuum cycle.

The superimposition of several portions of getter material may also apply to the previously described getter structures 100, 200, 300 and 400. In particular, several portions of getter material may be superimposed, and one or more portions of porous material (similar to the portion 108) may be combined with one or more portions of material including channels (similar to the portion 120).

An example embodiment of a getter structure 600 and a microelectronic device 2000 including an encapsulated microcomponent 1004 is now described in connection with FIGS. 7 and 8.

Figure 7:
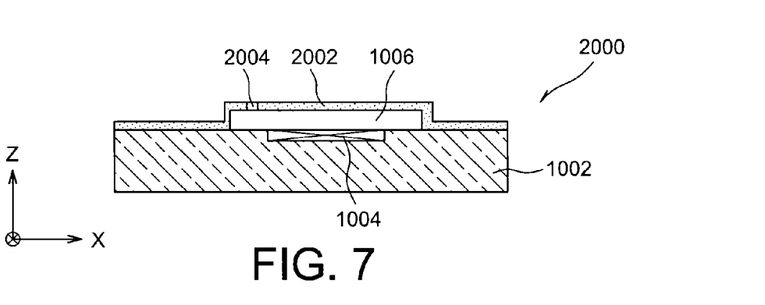

Like the previously described device 1000, the device 2000 includes the substrate 1002 on which the microcomponent 1004 is produced, for example of the MEMS and/or NEMS type (see FIG. 7). The microcomponent 1004 is encapsulated in the cavity 1006. Unlike the device 1000, the cavity 1006 is in this case closed by a cover 2002 of the TLP (Thin-Layer Packaging) type. The cover 2002 includes an opening 2004 forming a means of access to the interior of the cavity 1006, where this means of access is used, notably, during production of the device 2000, to remove a sacrificial material on which the thin layer forming the cover 2002 has been deposited.

The getter structure 600 is then produced on the previously produced elements of the device 2000.

A portion of porous material 108 is firstly produced (for example by a deposition through a stencil) on the cover 2002, where the opening 2004 is covered by a part of the portion of porous material 108. A portion of getter material 110 is then deposited on the portion of porous material 108, for example in the same atmosphere and through a stencil (with a similar pattern, following the example of FIG. 8).

Finally, the assembly is covered by a hermetic protective layer 130, obtained for example by a vacuum deposition (for example by evaporation or spraying) through a stencil.

Figure 8:
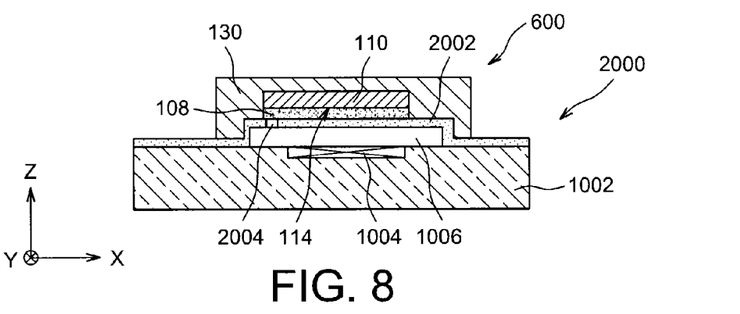

By this means, the device 2000 represented in FIG. 8 is obtained, in which the portion of getter material 110 causes an absorption and/or an adsorption of gas present in the cavity 1006 by its rear face 114 which is completely accessible via the opening 2004 and through the portion of porous material 108, for example enabling a low-pressure environment to be produced in the cavity 1006, around the microcomponent 1004.

The portions 108 and 110 together with the protective layer 130 will advantageously be deposited in the same vacuum cycle by evaporation depositions, or through stencils.

Figure 9A:
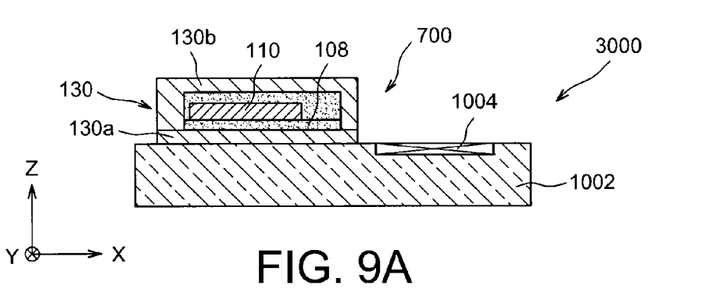
Figure 9B:
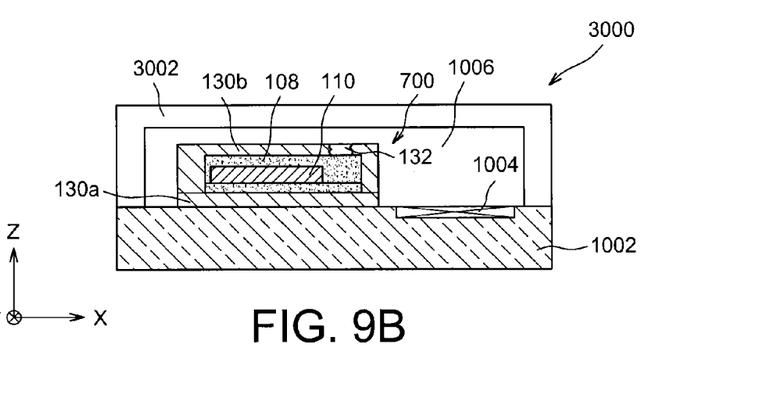

Reference is now made to FIGS. 9A and 9B, which represent the steps of production of a device 3000 including a microcomponent 1004 intended to be encapsulated, with a getter structure 700 in a cavity 1006.

The device 3000 includes the microcomponent 1004 produced on a substrate 1002. The getter structure 700 is also produced on the substrate 1002, next to the microcomponent 1004. The getter structure 700 includes the portion of porous material 108 which completely surrounds the portion of getter material 110. In addition the hermetic protective layer 130 completely surrounds the layer of porous material 108.

The getter structure 700 is, for example, obtained by firstly undertaking a deposition of a first part 130a of the hermetic protective layer 130, where this first part forms a portion of material (flat in this embodiment) positioned against the support 102. A first part (also in the form of a flat portion in this example embodiment) of the portion of porous material 108 is then formed on the first part 130a of the hermetic protective layer 130. The first portion of getter material 110 is then deposited on the first part of the portion of porous material 108. A second part of the portion of porous material 108 is then deposited on the portion of getter material 110 which is completely or partly surrounded by the portion of porous material 108. Lastly, a second part 130*b* of the hermetic protective layer 130 is deposited, such that this hermetic protective layer surrounds and hermetically protects the portion of getter material 110 and the portion of porous material 108. All these steps will advantageously be accomplished in the same vacuum cycle or in the same atmosphere.

As represented in FIG. 9B, a hermetic bonding of a cover 3002 on the substrate 1002 is then accomplished, in order to encapsulate the getter structure 700 and the microcomponent 1004 in the same cavity 1006.

When it is desired to "activate" the gaseous absorption and/or adsorption function of the getter material 110, an opening 132 is then made through the hermetic protective layer 130, for example by laser impact through the cover 3002, comprising for example glass or silicon, in a manner comparable with the example previously described in connection with FIG. 5C. The opening 132 emerges onto the surface of the portion of porous material 108.

Figure 10A:
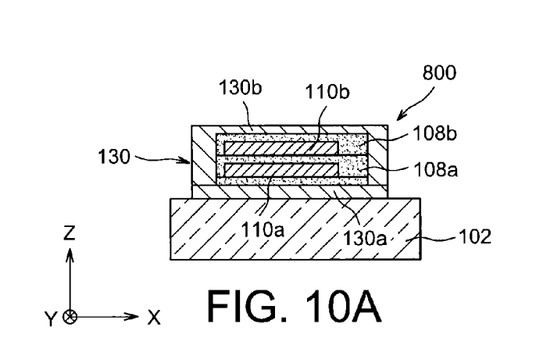
Figure 10B:
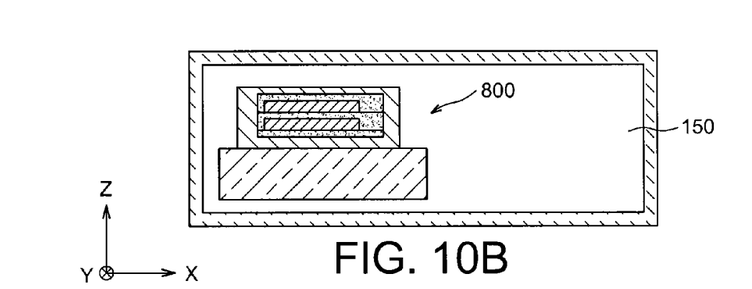
Figure 10C:
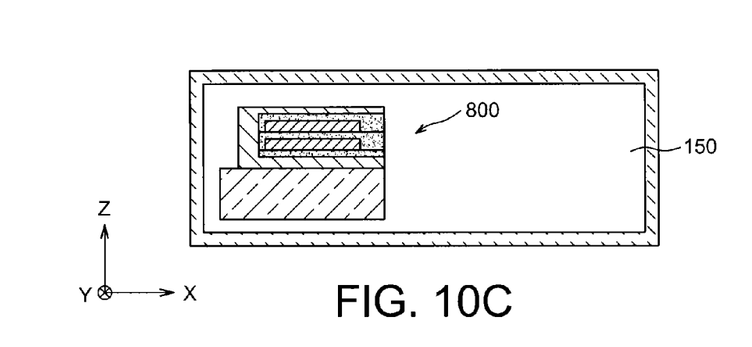

Reference is now made to FIGS. 10A to 10C to describe a getter structure 800 according to a sixth embodiment.

As represented in FIG. 10A, the getter structure 800 includes the same elements as the getter structure 500, except that only a portion of the support 102 is preserved. By this means a getter structure 800 is obtained which may be used independently, and which may, for example, be positioned in a cavity 150 of a device, for example in a screen tube (see FIG. 10B).

To activate the gas pumping function of getter structure 800, an opening of the getter structure 800 is created in order to expose a part of the portions of porous material 108*a*, 108*b* of the getter structure 800. This opening is, for example, obtained by breaking, for example by means of an impact of the structure 800 on a wall of the cavity 150, or by a laser firing, a part of the getter structure 800. It is possible to make an opening of the getter structure 800 easier by previously producing a mechanical starting point within the getter structure 800.

This opening may be made by keeping the portions of getter material 110*a*, 110*b* intact.

In the embodiments using a protective layer the getter material is generally made active after its deposition (when the different depositions have not been accomplished during the same vacuum cycle), and for example after its encapsulation in the protective layer 130, by a thermal activation step. For example, in the case of a getter material comprising titanium, such a thermal activation may be accomplished, for example, at a temperature of between approximately 350° C. and 450° C.

In all the previously described embodiments the portion or portions of getter material are flat due to the fact that the different supports onto which the portion or portions of getter material are produced have a roughly flat surface.

However, it can be that the surface of the gas-permeable material on which the portion of getter material is positioned is not flat, and has reliefs, for example projections, which enables the gaseous absorption and/or adsorption surface of the portion of getter material to be increased further.

In all the previously described embodiments, the portion of gas-permeable material may comprise getter material. A porous getter material may be obtained by a deposition accomplished at a deposition temperature Ts such that the ratio Ts/Tm is less than approximately 0.3, where Tm is the melting point of the getter material, and where temperatures Ts and Tm are expressed in Kelvin. When the porous getter material is deposited by evaporation under these deposition conditions, the porous getter material obtained then has a columnar structure including inverted cones (where the wider part of the cone is upwards) shaped like domes in the upper part, these cones being separated by empty spaces. The work "Materials Science of Thin Films", Second Edition, Milton Ohring, Academic Press, chapter 9.2.1.2 SZM for Evaporated Films, page 498, describes details of production of such a porous material. The gas-permeability of the portion of getter material may also be obtained by structuring portion of getter material 110 in order to form channels, or micro-channels, through it, as described in connection with FIG. 3.

In all the previously described embodiments and variants it can be that the permeability of the portion of material against which the portion of material is positioned is obtained via one or more channels formed in this portion of material.

The invention claimed is:

1. A getter structure, comprising:
    a support including one or more channels in a part of the support to form a portion of gas-permeable material;
    at least one portion of getter material positioned directly on the support, the support forming a wall of a cavity in which the portion of getter material is encapsulated, and at least one face of said portion of getter material is positioned against the one or more channels of the support such that said portion of getter material is able to achieve a gaseous absorption and/or adsorption at least by said face through at least said one or more channels of the support.

2. The getter structure according to claim 1, in which the portion of gas-permeable material comprises at least one porous material.

3. The getter structure according to claim 1, in which a part of the portion of gas-permeable material is not covered by the portion of getter material.

4. The getter structure according to claim 1, in which the portion of gas-permeable material surrounds all or part of the portion of getter material.

5. The getter structure according to claim 1, also including at least one protective layer which is hermetic to gases, covering a stack including at least the portion of gas-permeable material and the portion of getter material.

6. The getter structure according to claim 5, also including at least one opening formed through the protective layer hermetic to the gases, and emerging onto the stack.

7. The getter structure according to claim 1, including a stack of several portions of getter material and of several portions of gas-permeable material, where at least one face of each of the portions of getter material is positioned against at least one of the portions of gas-permeable material, such that each of the portions of getter material is able to achieve a gaseous absorption, or a gaseous adsorption, or both a gaseous absorption and a gaseous adsorption, by said face, through at least said one of the portions of gas-permeable material.

8. The getter structure according to claim 1, also including:
    at least one protective layer which is hermetic to gases, covering a stack including at least the portion of gas-permeable material and the portion of getter material,
    a stack of several portions of getter material and of several portions of gas-permeable material, where at least one face of each of the portions of getter material is positioned against at least one of the portions of gas-permeable material, such that each of the portions of getter material is able to achieve a gaseous absorption, or a gaseous adsorption, or both a gaseous absorption and a gaseous adsorption, by said face, through at least said one of the portions of gas-permeable material,
    and in which the protective layer hermetic to the gases covers the stack of portions of getter material and of portions of gas-permeable material, where at least one opening is formed through the protective layer hermetic to the gases and emerges onto the stack.

9. A device, comprising:
at least one microcomponent encapsulated in a cavity, and in which at least one getter structure according to claim 1 is positioned in the cavity.

10. The device according to claim 9, in which the cavity is formed between a substrate and a cover.

11. The device according to claim 10, in which the getter structure and the substrate are interdependent, or in which the getter structure and the cover are interdependent.

12. A device comprising; at least one microcomponent encapsulated in a cavity and surrounded by a hermetic protective layer; and a getter structure positioned outside of the cavity and including at least one portion of getter material, at least one face of the getter material being positioned against at least one portion of gas-permeable material such that said portion of getter material is able to achieve a gaseous absorption and/or adsorption at least by said face through at least said portion of gas-permeable material, in which at least one opening is formed through at least one wall of the cavity and covered by a part of the portion of gas-permeable material of the getter structure.

13. A method of producing a getter structure, comprising:
producing a support including one or more channels in a part of the support to form a portion of gas-permeable material;
producing at least one portion of getter material directly on the support, the support forming a wall of a cavity in which the portion of getter material is encapsulated, such that at least one face of the portion of getter material is positioned against the one or more channels such that said portion of getter material is able to achieve a gaseous absorption, or a gaseous adsorption, or both a gaseous absorption and a gaseous adsorption, by said face through at least said channel or channels.

14. The method according to claim 13, further comprising:
producing a protective layer hermetic to gases covering the portion of getter material and part of the channel or channels not covered by the portion of getter material.

15. The device according to claim 12, wherein the portion of gas-permeable material includes one or more channels through which the gaseous absorption and/or adsorption is achieved.

16. A method of producing a getter structure, comprising:
producing at least one portion of getter material on a support, wherein the support includes one or more channels through which the portion of getter material is able to achieve a gaseous absorption and/or adsorption; producing a protective layer on the portion of getter material to prevent exposure of the getter material to air outside of the protective layer; encapsulating the protective layer and the portion of getter material in a cavity formed on the support; and after the encapsulating, exposing the getter material to an inside of the cavity to activate the getter material.

17. The method according to claim 16, wherein the exposing includes forming an opening in the protective layer.

18. The method according to claim 16, wherein the exposing includes removing at least a portion of the protective layer.

19. The method according to claim 16, further comprising;
producing at least one portion of gas-permeable material on the getter material,
wherein the portion of gas-permeable material is protected by the protective layer, and
wherein the exposing the getter material includes forming an opening in the protective layer to access the portion of gas-permeable material such that the getter material is able to achieve a gaseous absorption, or a gaseous adsorption, or both a gaseous absorption and a gaseous adsorption, via the portion of gas-permeable material.

* * * * *